(12) United States Patent
Kang et al.

(10) Patent No.: US 9,927,311 B2
(45) Date of Patent: Mar. 27, 2018

(54) HIGH-SENSITIVITY SENSOR COMPRISING CONDUCTIVE THIN FILM CONTAINING CRACKS AND METHOD FOR MANUFACTURING SAME

(71) Applicants: Global Frontier Center For Multiscale Energy Systems, Seoul (KR); Seoul National University R&DB Foundation, Seoul (KR); Research & Business Foundation Sungkyunkwan University, Gyeonggi-do (KR)

(72) Inventors: Daeshik Kang, Seoul (KR); Yong Whan Choi, Gyeonggi-do (KR); Chanseok Lee, Seoul (KR); Kahp-Yang Suh, Seoul (KR); Tae-il Kim, Gyeonggi-do (KR); Man Soo Choi, Seoul (KR)

(73) Assignees: Global Frontier Center-Multiscale Energy Systems, Seoul (KR); SNU R&DB Foundation, Seoul (KR); Research & Business Foundation Sungkyunkwan Univ., Gyeonggi-do (KR)

( * ) Notice: Subject to any disclaimer, the term of this patent is extended or adjusted under 35 U.S.C. 154(b) by 119 days.

(21) Appl. No.: 14/895,764

(22) PCT Filed: Dec. 3, 2014

(86) PCT No.: PCT/KR2014/011790
§ 371 (c)(1),
(2) Date: Dec. 3, 2015

(87) PCT Pub. No.: WO2015/084061
PCT Pub. Date: Jun. 11, 2015

(65) Prior Publication Data
US 2016/0123820 A1    May 5, 2016

(30) Foreign Application Priority Data

Dec. 3, 2013 (KR) .................. 10-2013-0149217
Dec. 24, 2013 (WO) .............. PCT/KR2013/012081

(51) Int. Cl.
*G01L 1/22* (2006.01)
*G01R 27/08* (2006.01)
(Continued)

(52) U.S. Cl.
CPC ........ *G01L 1/2287* (2013.01); *C23C 14/5886* (2013.01); *G01H 11/06* (2013.01);
(Continued)

(58) Field of Classification Search
CPC ....... G01L 1/22; G01L 1/2287; G01L 9/0002; G01H 11/06; H05K 1/0283; H05K 1/0293;
(Continued)

(56) References Cited

U.S. PATENT DOCUMENTS 7,943,413 B2    5/2011   Kasai et al.
8,159,235 B2 *  4/2012   Lynch .................. G01R 27/02
                                                    324/691
(Continued)

FOREIGN PATENT DOCUMENTS

JP       2008-98524 A        4/2008
KR    10-2006-0102236 A      9/2006
(Continued)

OTHER PUBLICATIONS

Lee, "A Stretchable Strain Sensor Based on Metal Nanoparticle Thin Film for Human Motion Detector", KAIST Master's Thesis: Mechanical Engineering Major, Feb. 2013, 79 pages.
(Continued)

*Primary Examiner* — Hoai-An D Nguyen
(74) *Attorney, Agent, or Firm* — Christensen, Fonder, Dardi & Herbert PLLC; Peter S. Dardi

(57) ABSTRACT

A high-sensitivity sensor containing cracks is provided. The high-sensitivity sensor is obtained by forming microcracks on a conductive thin film, which is formed on top of a support, wherein the microcracks form a micro joining structure in which the microcracks are electrically changed, short-circuited or open, thereby converting external stimuli into electric signals by generating a change in a resistance value. The high-sensitivity sensor can be useful in a displacement sensor, a pressure sensor, a vibration sensor, artificial skin, a voice recognition system, and the like.

19 Claims, 11 Drawing Sheets

(51) Int. Cl.

| | |
|---|---|
| *G01H 11/06* | (2006.01) |
| *C23C 14/58* | (2006.01) |
| *G01L 9/00* | (2006.01) |
| *H05K 3/22* | (2006.01) |
| *H05K 1/02* | (2006.01) |
| *H05K 1/16* | (2006.01) |
| *G01R 27/02* | (2006.01) |
| *H05K 3/16* | (2006.01) |

(52) U.S. Cl.
CPC .............. *G01L 1/22* (2013.01); *G01L 9/0002* (2013.01); *G01R 27/08* (2013.01); *H05K 1/0283* (2013.01); *H05K 1/0293* (2013.01); *H05K 1/167* (2013.01); *H05K 3/22* (2013.01); *G01R 27/02* (2013.01); *H05K 3/16* (2013.01); *H05K 2201/09727* (2013.01); *H05K 2201/10053* (2013.01); *H05K 2201/10151* (2013.01); *H05K 2203/0271* (2013.01)

(58) Field of Classification Search
CPC ............ H05K 1/167; H05K 3/16; H05K 3/22; H05K 2201/09727; H05K 2201/10053; H05K 2201/10151; H05K 2203/0271; C23C 14/5886; G01R 27/00; G01R 27/02; G01R 27/08
USPC ................................ 324/600, 649, 691, 693
See application file for complete search history.

(56) References Cited

U.S. PATENT DOCUMENTS

| | | | |
|---|---|---|---|
| 8,468,872 B2 | 6/2013 | Lee et al. | |
| 2009/0230952 A1* | 9/2009 | Endo ................... | G01N 27/9046 324/238 |
| 2011/0245378 A1* | 10/2011 | Russ ........................ | C08K 3/04 523/440 |
| 2013/0133435 A1* | 5/2013 | Muramatsu .............. | G01B 1/00 73/799 |
| 2014/0290390 A1* | 10/2014 | Graudejus .............. | H05K 3/284 73/862.627 |
| 2016/0377493 A1* | 12/2016 | Hong ....................... | G01B 7/16 73/774 |

FOREIGN PATENT DOCUMENTS

| | | |
|---|---|---|
| KR | 10-2011-0075256 A | 7/2011 |
| KR | 10-1151662 B1 | 6/2012 |

OTHER PUBLICATIONS

Lee et al., "Stretchable Strain Sensor Based on Metal Nanoparticle Thin Film for Human Motion Detection & Flexible Pressure Sensing Devices", KAIST, Transducers, pp. 2624-2627, Jun. 2013.

* cited by examiner

HIGH-SENSITIVITY SENSOR COMPRISING CONDUCTIVE THIN FILM CONTAINING CRACKS AND METHOD FOR MANUFACTURING SAME

CROSS REFERENCE TO RELATED APPLICATIONS

This application is a national phase filing of PCT Application No. PCT/KR2014/011790 to KANG et al., filed Dec. 3, 2014, entitled "High-Sensitivity Sensor Comprising Conductive Thin Film Containing Cracks and Method For Manufacturing Same," which claims priority to Korea Application No. PCT/KR2013/012081 filed Dec. 24, 2013, entitled "High-Sensitivity Sensor Comprising Conductive Thin Film Containing Cracks and Method For Manufacturing Same," which claims priority to Korea Application No. 10-2013-0149217 filed Dec. 3, 2013, entitled "High-Sensitivity Sensor Comprising Conductive Thin Film Containing Cracks and Method For Manufacturing Same," which are hereby incorporated herein by reference.

TECHNICAL FIELD

The present invention relates to a highly sensitive sensor including a cracked conductive thin film and a method for fabricating the same. More specifically, the present invention relates to a multifunctional, highly sensitive sensor using a microcracked conductive thin film to sense displacements, vibrations and/or pressures, and a method for fabricating the sensor in a simple and economical manner.

BACKGROUND ART

Generally, highly sensitive sensors are systems adapted to sense minute signals and convert the sensed signals into data such as electrical signals. Highly sensitive sensors are essential components in modern industries. Examples of known sensors for pressure or tensile force measurement include capacitive sensors, piezoelectric sensors, and strain gauges.

However, such sensors can be operated only under specific environmental conditions or are affected by various environmental factors aside from pressure, resulting in inaccuracy of measured values and making it difficult to guarantee consistency of measured values upon repeated operation. The inherent structural problems of these sensors impede the manufacture of flexible structures.

Conventional microphones for voice recognition suffer from the problem of low recognition rate in extremely noisy environments due to their poor ability to filter noise.

Under these circumstances, there is a need to develop new concepts of highly sensitive sensors and voice recognition systems that are free from the problems of the prior art.

DISCLOSURE OF THE INVENTION

Technical Problem

It is an object of the present invention to provide a multifunctional, highly sensitive sensor that is less affected by environmental factors and can sense extremely small changes in displacement, vibration and/or pressure with high sensitivity while maintaining the accuracy of measured values despite repeated use.

It is a further object of the present invention to provide a method for fabricating the highly sensitive sensor.

Solution to Problem

According to an aspect of the present invention, there is provided a highly sensitive sensor including:
a support; and
a conductive thin film formed on at least one side of the support,
wherein the conductive thin film includes cracks, at least some of which have opposing surfaces in partial contact with each other, the crack surfaces undergo a variation in contact area or disconnection-reconnection events to cause a change in electrical resistance while moving relative to each other in response to external physical stimuli, and the sensor detects the resistance change to measure the external stimuli.

According to a further aspect of the present invention, there is provided a method for fabricating a highly sensitive sensor, the method including:
forming a conductive thin film on at least one side of a support, and
inducing cracks in the conductive thin film.

Advantageous Effects of the Invention

The highly sensitive sensor of the present invention uses a cracked conductive thin film formed on one side of a support to measure pressures and/or vibrations with high sensitivity. The highly sensitive sensor of the present invention can be utilized in various applications, such as vibration sensors, pressure sensors, and strain gauges.

The highly sensitive sensor of the present invention can find application in various fields, such as artificial skins and voice recognition systems, due to its ability to form a flexible structure.

The highly sensitive sensor of the present invention can be fabricated in a simple manner on an industrial scale, thus being advantageous from an economic viewpoint.

BEST MODE FOR CARRYING OUT THE INVENTION

Figure 1:
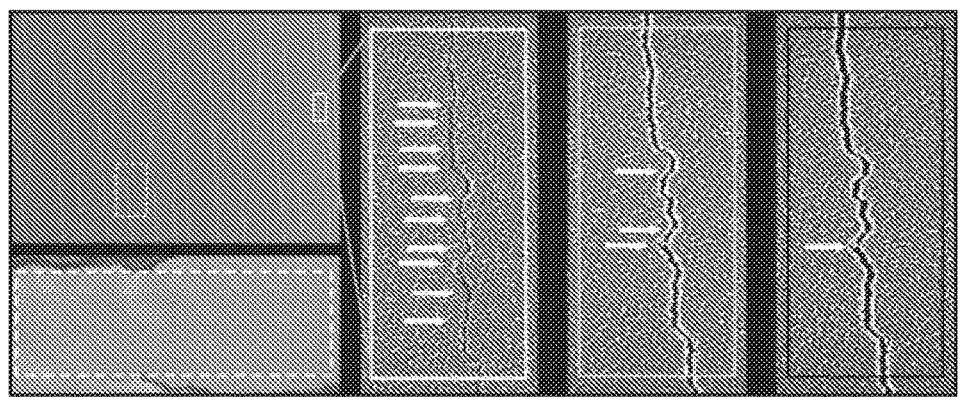
FIG. 1 shows microcracks formed in a platinum thin film of a highly sensitive sensor according to one embodiment of the present invention.

As the present invention allows for various changes and numerous embodiments, particular embodiments will be illustrated in drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, detailed explanations of related art are omitted when it is deemed that they may unnecessarily obscure the essence of the present invention.

A more detailed description will be given of a highly sensitive crack-based sensor according to an embodiment of the present invention.

The highly sensitive sensor includes a support and a conductive thin film formed on at least one side of the support. The conductive thin film includes micro cracks whose opposing surfaces move relative to each other in response to external environmental changes to cause changes in electrical properties. The sensor uses the changes in electrical properties.

Generally, small nuclei of a metal are formed when a thin film of the metal is formed by deposition. The nuclei grow into the thin film while forming grain boundaries. Deformation of the grain boundaries of the metal by an external stimulus causes the accumulation of stress around the boundaries, resulting in the formation of cracks along the grain boundaries. Such cracks have been considered as defects that cause many imperfections, and considerable research efforts have focused on the minimization of cracks to date.

In the present invention, the cracks of the conductive thin film are artificially formed to have minute interconnections through which the highly sensitive sensor can electrically sense extremely small changes in displacement, pressure or vibration. That is, at least some of the cracks formed along grain boundaries created upon formation of the conductive thin film have opposing surfaces in partial contact with each other. The crack surfaces in contact with each other move relative to each other when an external stimulus, such as a change in vibration or pressure, is applied. At this time, the crack surfaces may undergo a variation in contact area, causing a change in electrical resistance, or the cracks may be electrically shorted or open, causing a drastic change in the resistance value of the conductive thin film. This change is detected by the conductive thin film structure. As a result, the highly sensitive sensor can be utilized as a displacement sensor, a vibration sensor, a pressure sensor or a strain gauge.

According to one embodiment, the cracks present in the conductive thin film may take various forms depending on the morphology of the grain boundaries of the conductive thin film. The number of the cracks is not particularly limited and may vary depending on various factors such as the thickness and formation conditions of the conductive thin film.

FIG. 1 exemplarily shows cracks formed in an about 20 nm thick platinum thin film. FIG. 1 also shows partially enlarged images of the nano-sized crack structures formed by bending the platinum thin film formed on a support. Here, the cracks are formed in one direction, that is, in a direction perpendicular to the plane of the paper, and have a structure in which the crack lines are disconnected from each other (see the dashed line box) or are elongated (see the solid line box).

The enlarged images of the crack lines in the solid line box reveal the presence of crack surfaces opposed to each other, crack surfaces in contact with each other, and crack surfaces whose edges are spaced from those of the adjacent cracks at certain intervals. The crack surfaces in contact with each other move relative to each other when external physical stimuli are applied to the cracks. At this time, the crack surfaces may undergo a variation in contact area or may be spaced apart from each other, and as a result, the electrical resistance of the conductive thin film may be changed, causing electrical shorting. The crack surfaces separated by the external stimuli are again brought into contact with each other by other external stimuli, causing a change in electrical resistance. The crack surfaces in contact with each other before the application of external stimuli move relative to each other by the external stimuli, causing an increase in electrical resistance. This resistance change can be measured to determine the presence and strength of the external stimuli. The crack surfaces spaced from each other at intervals of several nm before the application of external stimuli may also be brought into contact with each other by the external stimuli, causing a change in electrical resistance.

A metal which can be used as a material for the cracked conductive thin film is not limited so long as it has grains and can grow into a crystalline thin film, that is, it is polycrystalline. For example, the material for the conductive thin film may be platinum, nickel, copper, gold, silver, iron, chromium, magnesium, zinc, tin, aluminum, cobalt, manganese, tungsten, cadmium, palladium, carbon, or a mixture or alloy thereof. For enhanced sensitivity of a sensor, it is preferred that the conductive thin film has a low electrical resistance in the absence of external stimuli and undergoes a significant change in its electrical resistance with varying degrees of contact between the crack surfaces in the presence of external stimuli. In view of this, the use of a highly conducting metal, such as platinum, copper or aluminum, for the formation of the conductive thin film is advantageous in fabricating a highly sensitive sensor.

According to one embodiment, the conductive thin film is not limited to a specific thickness but is preferably thick enough to form the cracks by mechanical methods such as adding tension and bending. The conditions for crack formation may vary depending on the kind of the metal. For example, the conductive thin film may have a thickness of 20 to 40 nm or a thickness of 60 nm.

The support, on which the conductive thin film is formed, may be a polymer film. The support may have a monolayer or multilayer structure. For example, the support may have a multilayer structure consisting of a base film and a flexible polymer layer formed on the base film. Examples of suitable flexible polymers include, but are not limited to, polyurethane acrylate, polystyrene, polyethylene glycol, and Norland Optical Adhesive (NOA). Examples of materials suitable for the base film include, but are not limited to, polyethylene terephthalate, polyimide, and polydimethylsiloxane (PDMS).

The support may have a thickness of 20 to 50 μm but is not limited to this thickness.

In the multilayer structure of the support, the base film may have a thickness of 20 to 50 μm but is not limited to this thickness. The flexible polymer layer may have a thickness of 1 to 10 μm but is not limited to this thickness.

A layer may be further formed on the conductive thin film, which is formed on at least one side of the support. The additional layer may be formed using the same material as the flexible polymer layer.

The highly sensitive crack-based sensor of the present invention can be fabricated by the following procedure.

First, a support is made by a general technique. Then, a conductive thin film is formed on at least one side of the support by a suitable technique such as deposition. Thereafter, cracks are induced in the conductive thin film.

According to one embodiment, the material for support may be a base film in the form of a thin film and may be, for example, a 20 to 50 μm thick polyethylene terephthalate, polyimide or polydimethylsiloxane film. Any electrically non-conductive material may be used for the support. The support may be appropriately selected depending on how much tensile force is applied or to which sort of stimulus, for example, tension/force or vibration, the highly sensitive sensor responds. The thickness of the support may also be appropriately selected depending on the intended applications.

The conductive thin film may be directly attached on the support having a monolayer structure. Alternatively, a flexible polymer layer may be further formed on the support to achieve improved adhesion of the support to the conductive thin film and excellent bending property of the support. Another function of the flexible polymer layer is to control the density and morphology of the cracks. The polymer layer allows firmer bonding of the conductive thin film to the support and easier stretching or bending, which facilitates the formation of the cracks. Further, the polymer layer controls a difference in modulus between the base film and the metal to vary the density, length and shape of the cracks. The polymer layer can play an important role in controlling the sensitivity and vibration frequency recognition range of the sensor.

The polymer layer may be formed using a polymer such as polyurethane acrylate (PUA), polystyrene (PS), polyethylene glycol, Norland Optical Adhesive (NOA) or polydimethylsiloxane (PDMS). Other materials may be used to form the polymer layer. A suitable coating technique may be used to form the polymer layer. The coating technique may be different depending on the material of the polymer layer. In the case of UV curable materials such as PUA, PEG or NOA, which are in the form of liquid at the initial stage and become hard solid after irradiation with UV light (I-line; 365 nm), spin coating may be used to form a thin film having a uniform thickness. Spin coating is a technique for forming a thin film having a uniform thickness based on fast spinning. The coating thickness may be adjusted by the spinning velocity and may be affected by the viscosity of the material or the ambient humidity.

Aside from this, a crystalline silicon wafer may be used to form the polymer layer. In this case, the extremely small surface roughness of the silicon wafer enables the formation of a flat surface. For example, after a predetermined amount of the UV curable liquid polymer is sprayed on at least one side of the support layer using a dropping pipette, the crystalline silicon wafer is attached to and pressed on the coated support layer to achieve uniform coating of the liquid polymer. The thickness of the polymer layer is adjusted to a desired level by controlling the pressing force. For example, the polymer layer may have a thickness ranging from 1 to 10 μm under the pressure of 10 to 30 Pa for 10 to 60 min. The pressing can induce the escaping of the liquid polymer confined between the silicon and the support layer. A suitable material such as tissue paper or oilpaper may also be used to adsorb the liquid polymer. The coated polymer layer is placed in a UV chamber (wavelength 365 nm) and cured by UV for a predetermined time, for example, 30 seconds to 5 minutes, to form a thin film.

Further, PS may be used as a material for the polymer layer. In this case, PS is dissolved in toluene, an organic solvent, and then the PS solution is thinly coated on the support layer by spin coating. After coating, the toluene is removed by evaporation on a hot plate or oven at about 30 to 80° C. for 1 to 30 minutes to form a thin film.

The conductive thin film may be formed on the support having a monolayer or multilayer structure by a general deposition technique, for example, chemical vapor deposition (CVD), sputtering, E-gun evaporation or thermal evaporation. The conductive thin film may be formed using one or more of the above-described metals. The pattern of crack formation may vary depending on the deposition conditions affecting the state of the layer material, as well as on the kind and thickness of the metal layer. In the present invention, the metal layer is formed by sputtering using highly electrically conductive platinum. The metal is deposited to a thickness which is predetermined given the fact that it is easier to form cracks with smaller deposition thickness. An excessively small thickness of the conductive thin film leads to poor electrical properties. Therefore, the conductive thin film is preferably required to have a proper thickness.

The metal is deposited on the polymer layer through a metal shadow mask perforated with a central hole. This deposition makes it easy to freely change the shape of the sensor. For example, a notch having a predetermined size may be formed in the central portion of the film in the lengthwise direction. The notch shape is formed to mark where cracks are formed. The notch formation is not necessary but optional.

After the formation of the conductive thin film on the support, cracks can be formed in the conductive thin film. The crack positions are not specifically limited. For example, the cracks may be formed along grain boundaries. The cracks may be irregularly formed in various morphologies. However, external conditions may affect the average morphology of the cracks. Methods for the formation of the cracks are broadly divided into two methods: physical methods, such as tension and bending, and chemical methods using etching solutions. A physical method is preferred for the support made of a polymer. For example, the cracks may be formed by pure bending in which the film is wound on a glass rod having a diameter of 1 to 10 mm. At this time, it should be understood that the morphology of the cracks may vary depending on the thickness of the metal layer and the state of the layer material.

In the case where the support is stretchable, tension is a useful mechanical method for crack formation. In this case, a tensile force (i.e. a pulling force) is applied to both ends of the support. Then, the structurally strong conductive thin film formed on the support receives the force above its tensile limit, resulting in crack formation. The magnitude of the tensile force may be appropriately determined taking into consideration the thin film thickness. If the tensile force is insufficient, the formation of cracks is not satisfactory. Meanwhile, if the tensile force is strong, there is a risk that the conductive thin film may be damaged. Bending may be used as another mechanical method for the stretchable support.

When stretching is used for crack formation, cracks can be uniformly formed over the entire region of the conductive thin film. At this time, the magnitude of the tensile force can be appropriately controlled to vary the size and number of the cracks. Even in a state in which the tensile force is released, the cracks may still remain to form minute interconnections.

The support may be in the form of a non-stretchable film. In this case, even when a tensile force is applied to both ends of the film, the number of cracks formed in the conductive thin film is negligible due to the limited stretchability of the film. Bending may be used as an alternative mechanical method. According to the bending method, most cracks are formed in regions where the conductive thin film is bent and it is thus easy to control the cracked regions. The control over the bending angle makes it easy to vary the size and number of cracks and the area where cracks are formed.

The cracks thus formed may have a very small thickness in the nanometer range, for example, from 0.1 to 400 nm. The thickness of the cracks can be determined by measuring the thickness of the largest one of the cracks formed in the lengthwise direction.

The length and population of the cracks are not limited and may vary depending on the size of the thin film used; or the degree of stretching or bending applied to the thin film. The minute interconnections of the cracks and the resulting electrical properties may vary depending on the physical factors (such as thickness or length) of the cracks.

Figure 2:
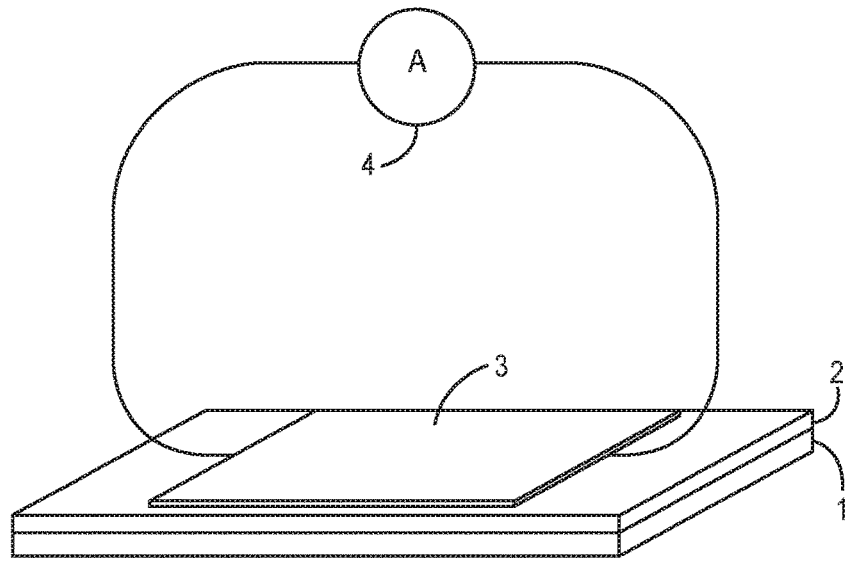
FIG. 2 is a schematic view illustrating a highly sensitive sensor according to one embodiment of the present invention.

FIG. 2 is a schematic view illustrating a highly sensitive sensor according to one embodiment of the present invention. As illustrated in FIG. 2, a conductive thin film 3 is formed on a support including a base film 1. If needed, a flexible polymer layer 2 is further formed on the base film 1. Both ends of the conductive thin film 3 are connected to each other via a detector 4. The main function of the detector 4 is to detect the electrical resistance of the conductive thin film. The detector 4 should measure low resistance values. To this end, the detector 4 is connected in series with the conductive thin film, like a general ammeter.

The highly sensitive crack-based sensor of the present invention is a reversible electric connection sensor having a very low resistance that uses nanoscale cracks to measure external stimuli. The highly sensitive sensor of the present invention is a multifunctional sensor that can measure pressures, strains and vibrations. The use of a flexible material as the support adapted to support the conductive thin film makes the highly sensitive sensor flexible. The highly sensitive sensor of the present invention responds sensitively to very low pressures and forces and is highly sensitive to slight changes within the pressure and force ranges that can be measured by the detector.

In addition, the cracks, i.e. the nanoscale interconnections, tend to return to their original states after measurement. Accordingly, there are no substantial differences in measured values during repeated use. The highly sensitive sensor of the present invention can be fabricated in an easy manner due to its inexpensive materials and simple structure. For these reasons, the highly sensitive sensor of the present invention can find wide applications in various fields.

The highly sensitive crack-based sensor suitable for use in a reversible electric sensor uses the nanoscale interconnections of cracks and has a very low electrical resistance, achieving high sensitivity. That is, the highly sensitive sensor having the reversible electrical interconnection systems can exhibit very high sensitivity because the nanoscale crack surfaces undergo a variation in contact area or disconnection-reconnection events to cause drastic changes in electrical properties while moving relative to each other in response to external physical stimuli. For example, the highly sensitive sensor may have a gauge factor of about 1 to $5 \times 10^8$ and a high pressure sensitivity in the range of about 0.1 to 1,000 $kPa^{-1}$. The highly sensitive sensor of the present invention is applicable to a variety of fields such as flexible supports and can be used repeatedly.

An artificial skin may be exemplified as another application of the highly sensitive sensor according to the present invention. Organisms on lower branches of the evolutionary tree have stronger ability in skin regeneration. On the contrary, those on higher branches have poorer power of skin reproduction. Humans are considered having poorer skin regeneration ability than any other organism. Minor skin injuries are healed naturally, but serious skin injuries such as burns cannot be recovered. In this case, artificial skins are used. Artificial skins capable of sensing stimuli are currently the greatest issues in related field. Artificial skins made of collagen cannot sense external stimuli due to their characteristics. Skin is the outermost covering of the body and thus necessarily requires the ability in sensing stimuli. The highly sensitive sensor of the present invention can be very thinly fabricated because it uses changes in the resistance of the minute interconnections present in the single conductive thin film. The highly sensitive sensor of the present invention is suitable for use in an artificial skin in that it can respond to very weak stimuli. The highly sensitive sensor of the present invention can recognize pressures, strains and vibrations simultaneously, which is a function similar to that of actual skins, and can sense stimuli repeatedly. In addition, the highly sensitive sensor of the present invention is bendable because it is made of a flexible material, facilitating the application of the highly sensitive sensor to artificial skins.

A voice recognition system may be exemplified as another application of the highly sensitive sensor according to the present invention. A conventional voice recognition system is operated in such a manner that a voice signal transmitted through air is recognized by a microphone; the recognized signal is divided into syllable or phoneme units; and the units are matched to data from an existing database. The conventional voice recognition system shows very high recognition rate in a quiet environment. However, when a speaker's voice is mixed with noise, it is very difficult to separate the voice from the noise, resulting in poor recognition rate. In contrast, when the highly sensitive vibration sensor of the present invention is attached to the skin, it can filter noises transmitted through air and recognize only vibrations from speaker's voices transmitted through the skin, achieving markedly increased recognition rate.

The present invention will be explained in more detail with reference to the following examples, including comparative examples. However, these examples are provided for illustrative purposes only and are not intended to limit the scope of the invention.

MODE FOR THE INVENTION

Example 1

Liquid polyurethane acrylate was applied onto a 50 μm thick polyethylene terephthalate (PET) base film having a size of 70 mm×70 mm, and then a flat silicon wafer and an about 2 kg book were sequentially placed thereon. The structure was left standing for about 30 min. After removal of the book, the support layer, to which the wafer was bonded, was allowed to face a UV lamp and irradiated with 365 nm UV light for about 1 min to form an about 3 μm thick flexible polymer layer on the base film.

A SUS shadow mask (about 200 μm thick) having a size of about 8 mm×35 mm and an about 5 mm hollow formed in the central portion thereof was attached to one side of the support, and platinum was deposited thereon using a sputtering system (MHS-1500, Moohan Vacuum Corp.) to form a 20 nm thick platinum thin film. The deposition was performed under the following conditions:

Power: RF300W, Base Pressure: $3.0 \times 10^{-6}$ Torr, Process Pressure: 5 mTorr, Distance: 140 mm, Time: 36-40 sec.

Subsequently, the base film deposited with the metal through the mask was cut to a rectangular size of 10 mm×37 mm at an interval of about 1 mm along the shape of the mask with a knife or scissors. The resulting rectangular film was fixed at both ends thereof and the central hollow region was wound on a glass rod having radii of curvature of 1 mm, 2 mm, and 3 mm to form nanoscale cracks, completing the fabrication of a highly sensitive sensor. The pattern of cracks is dependent on the magnitude of tension. In this example, pure bending was performed to form cracks.

Next, a silver paste as a conductive material was spread on both ends of the sensor and an electric wire was connected thereto.

Figure 3:
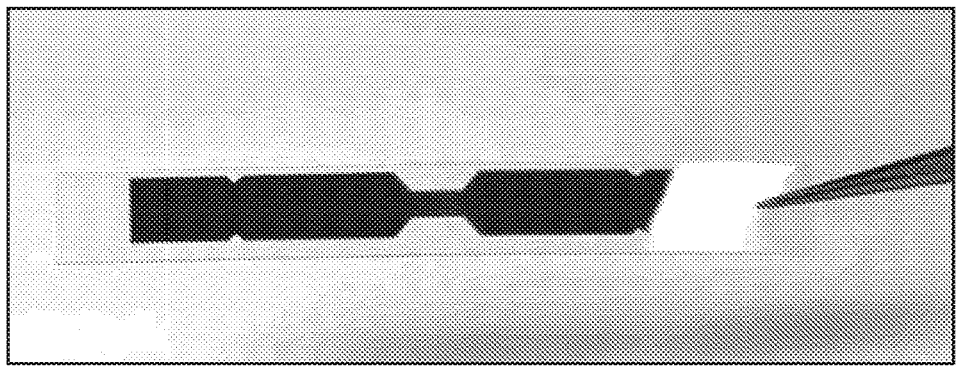
FIG. 3 shows a highly sensitive sensor fabricated in Example 1.
Figure 4:
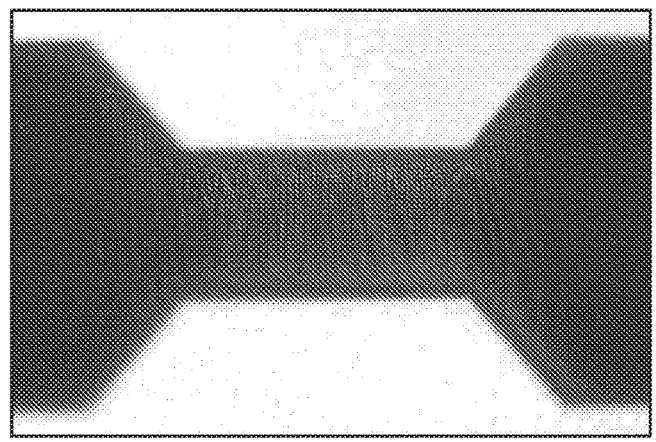
FIG. 4 is an enlarged image of a portion of a highly sensitive sensor fabricated in Example 1.
Figure 5:
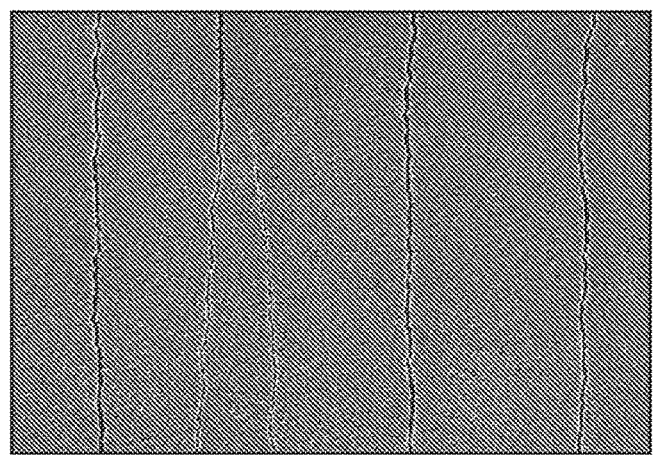
FIG. 5 is an enlarged image of cracked portions of a highly sensitive sensor fabricated in Example 1.

A SEM image of the highly sensitive sensor is shown in FIG. 3. FIG. 4 is an enlarged image of a portion of the highly sensitive sensor. FIG. 5 is an enlarged image of the central hollow region.

As shown in FIG. 5, microcracks were formed in the platinum thin film.

Figure 6:
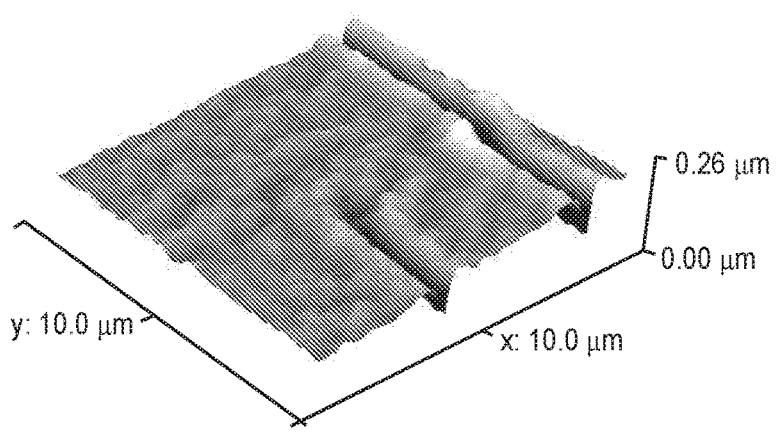
FIG. 6 is an atomic force microscopy image showing a cracked portion of a highly sensitive sensor fabricated in Example 1.

FIG. 6 is an atomic force microscopy image of the microcracks present in the platinum thin film. This image clearly shows that the cracks were formed on a nanometer scale in the platinum thin film.

Experimental Example 1: Repeated Bending Experiment

Figure 7:
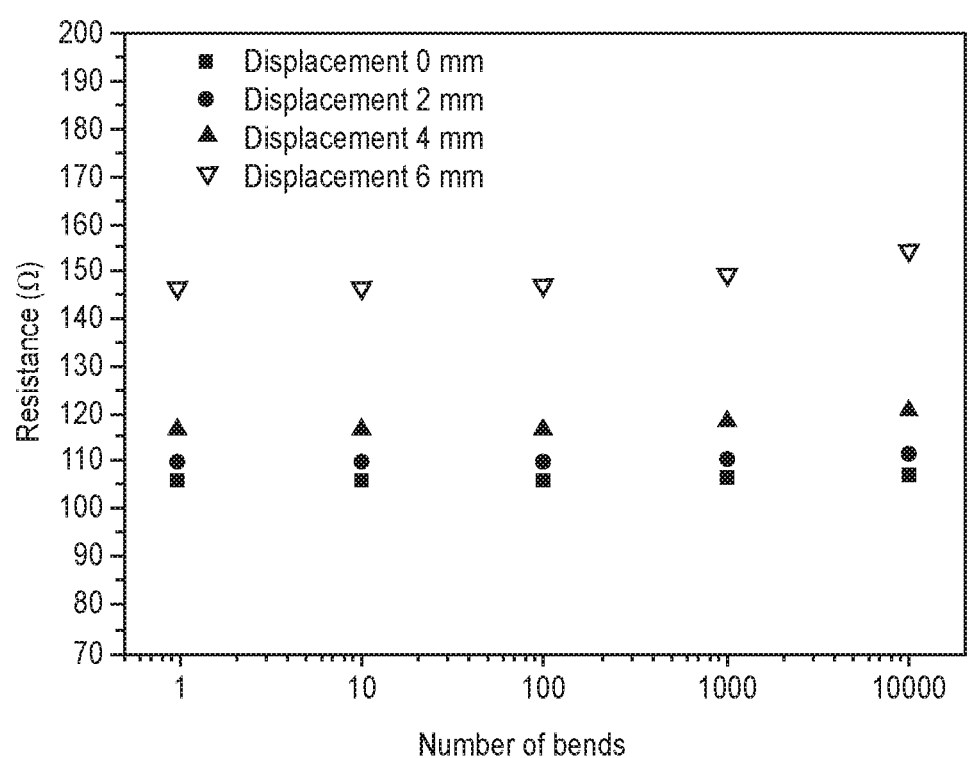
FIG. 7 shows changes in the resistance of a highly sensitive sensor fabricated in Example 1 depending on the number of bends.

Both ends of the highly sensitive crack-based sensor fabricated in Example 1 were fixed to a tensile tester (Instron) capable of regulating tensions in the range of tens of micrometers (gauge length=25 mm, gauge marks were removed because the sensor was film type). The sensor was repeatedly bent 10,000 times at four displacements of 0, 2, 4, and 6 mm in the shrinkage direction. Changes in resistance were measured after 1, 10, 100, 1,000, and 10,000 bends. The results are shown in FIG. 7. Since the grips of the tensile tester clamping both ends of the film were electrically conductive, the metal layers at both ends of the sensor clamped with the grips were peeled off.

In this experiment, the two electrodes extending from both ends of the sensor were connected to a detector, which was connected to a computer via a computer-dedicated cable, and the resistance values were collected in text files. PXI-4071 (National Instruments) was used as the detector. The sampling rate per second was set to 100.

As can be seen from the graph of FIG. 7, there were no substantial changes in the resistance values despite 10,000 bends. These results demonstrate that repeated use of the highly sensitive sensor fabricated in Example 1 causes no substantial change in the crack structure.

Figure 8:
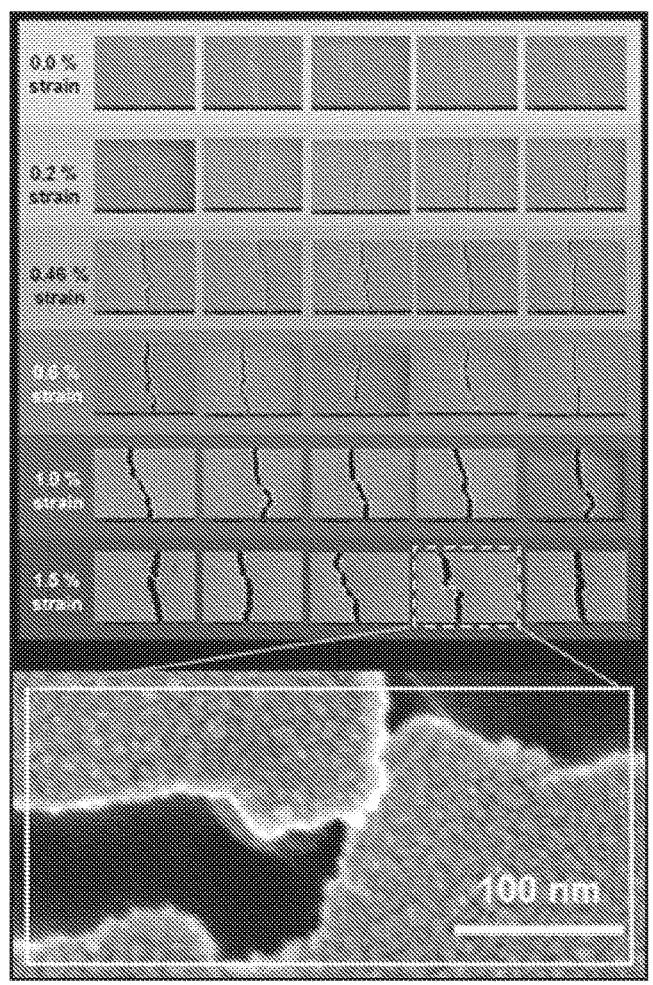
FIG. 8 shows the states of a highly sensitive sensor fabricated in Example 1 in which crack surfaces moved away from each other with increasing strain.

When the sensor was stretched, the crack surfaces were observed to move away from each other. The opposing crack surfaces moved further away from each other with increasing strain. The results are shown in FIG. 8. The intervals between the crack surfaces were only a few nanometers at the initial stage and increased to about 60-70 nm at a strain of 1%. However, some of the crack surfaces still remained in contact with each other even at a strain of 1.5% (see the solid line box in FIG. 8). That is, the crack surfaces in contact with each other underwent a variation in contact area while moving relative to each other by the application of strains or were spaced apart from each other when higher strains were given.

Experimental Example 2

Figure 9:
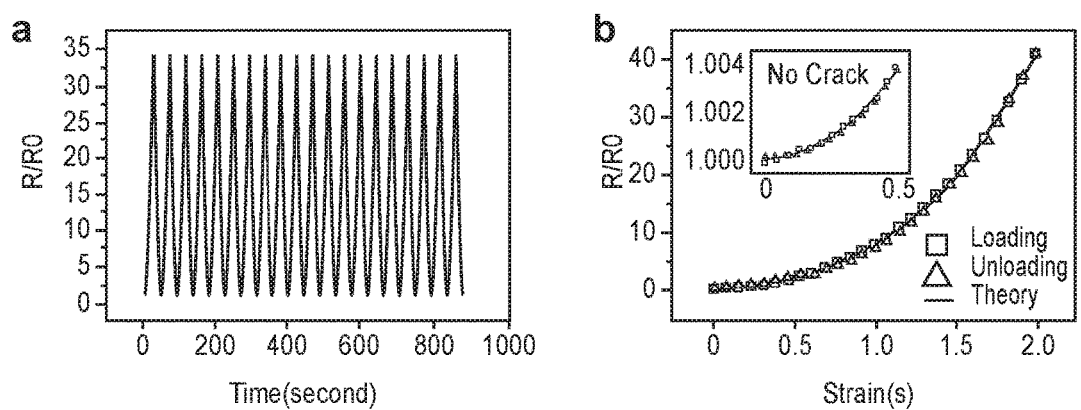
FIG. 9 shows changes in the electrical resistance of a patterned, highly sensitive sensor fabricated in Example 1 with varying strains applied to the sensor.

Changes in the resistance of the sensor were measured by stretching the sensor in a state in which a current was applied to the sensor, as shown in FIG. 2. FIG. 9 shows changes in the electrical resistance of the sensor with varying strains applied to the sensor. Specifically, FIG. 9a shows changes in the electrical resistance of the sensor measured by stretching the sensor to a maximum strain of 2% at a rate of 1 mm/min and allowing the stretched sensor to return to the original state (i.e. 0% strain), and FIG. 9a shows changes in the electrical resistance of the sensor measured by stretching the sensor to a maximum strain of 2% at a rate of 0.1 mm/min and allowing the stretched sensor to return to the original state (i.e. 0% strain).

As shown in FIG. 9a, the electrical resistance increased up to 35 times the initial resistance and the same resistance profiles were obtained reproducibly. These results are because the crack surfaces in contact with each other moved relative to each other with increasing strain, resulting in a reduction in their contact area, and finally they were spaced apart from each other, resulting in a sharp increase in electrical resistance. When the strain was removed, the sensor underwent shrinkage. As a result of this shrinkage, the separated crack surfaces were again brought into contact with each other and their contact area increased, resulting in a reduction in resistance. Finally, the sensor returned to the original state. The electrical resistance values of the sensor were measured by stretching the sensor at a rate of 0.1 mm/min. The results are shown in FIG. 9b. The electrical resistance of the sensor at a strain of 2% was at least 40 times higher than the initial resistance. When the strain was removed (unloading), the resistance of the sensor returned to the original value. That is, the sensor showed a reversible change in resistance. The resistance change was dependent on the stretching rate. For a rate of 0.1 mm/min, the sensitivity of the sensor at a strain of 2% was found to exceed 2000. The sensitivity was defined as resistance change/initial resistance/strain.

The inset of FIG. 9b shows changes in the resistance values of the unpatterned platinum thin film formed in Example 1. The crack-free platinum thin film showed no significant change in resistance. "Theory" in FIG. 9b represents theoretical modeling and was well consistent with the experimental values.

Figure 10:
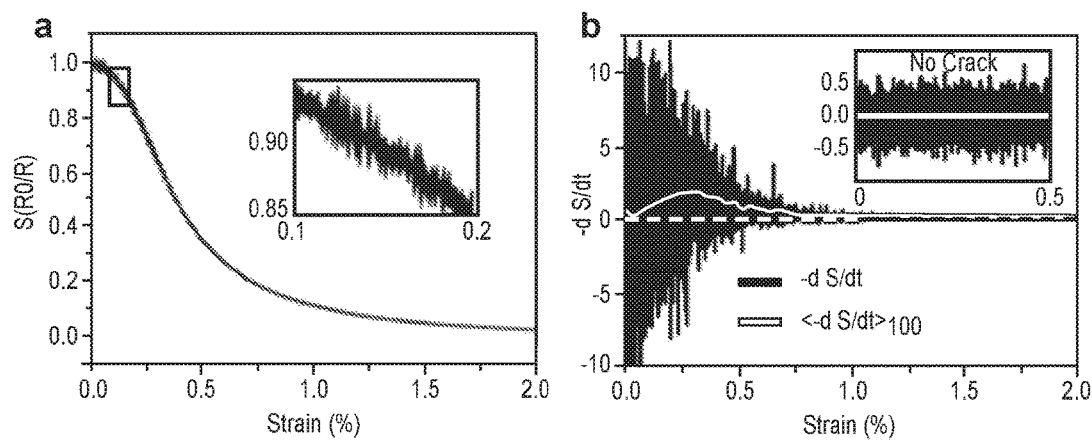
FIG. 10 shows changes in the conductance of a patterned, highly sensitive sensor fabricated in Example 1 with varying strains applied to the sensor.

FIG. 10 shows changes in the conductance of the highly sensitive sensor fabricated in Example 1 with varying strains applied to the sensor. Specifically, FIG. 10a is a graph showing the conductance (i.e. initial resistance/resistance ratio (R0/R), S) values of the sensor and FIG. 10b shows the negative values of the derivatives of the conductance values with respect to strain (10b).

Referring to FIG. 10a, when strains were applied, the intervals between the crack surfaces tended to increase, resulting in a reduction in the conductance of the cracked thin film. The inset of FIG. 10a is an enlargement showing a change in initial conductance. As can be seen from FIG. 10a, the conductance fluctuated depending on the given strains. FIG. 10b shows the negative values of the derivatives of the fluctuating conductance values with respect to strain. The results are displayed as a number of peaks with positive and negative values and are attributed to the conductance values fluctuating when the strains were applied. In FIG. 10b, the peaks with positive values indicate the moments at which the opposing crack surfaces in contact with each other were spaced apart from each other when strains were applied. The peaks with positive values indicate the moments at which the separated crack surfaces were again brought into contact with other crack surfaces when the sensor shrunk in a direction perpendicular to the stretching direction. When stretched, the polymer support with a positive Poisson's ratio shrunk in a direction perpendicular to the stretching direction. The averages for 100 data of the positive and negative peaks are represented in red and had positive values. These results show that when the sensor was stretched, the opposing crack surfaces were spaced apart from each other and were again brought into contact with each other. This process resulted in an average reduction in the conductance of the thin film. These results are in agreement with the results of FIG. 9 where the resistance of the thin film tended to increase when the sensor was stretched.

The inset of FIG. 10b shows the negative values of the derivatives of the conductance values of the unpatterned platinum thin film produced in Example 1 with respect to strain (10b). The term "unpatterned" refers to the absence of cracks. The magnitudes of the conductance derivatives of the crack-free thin film were much lower than those of the cracked conductive film.

Example 2

Figure 11:
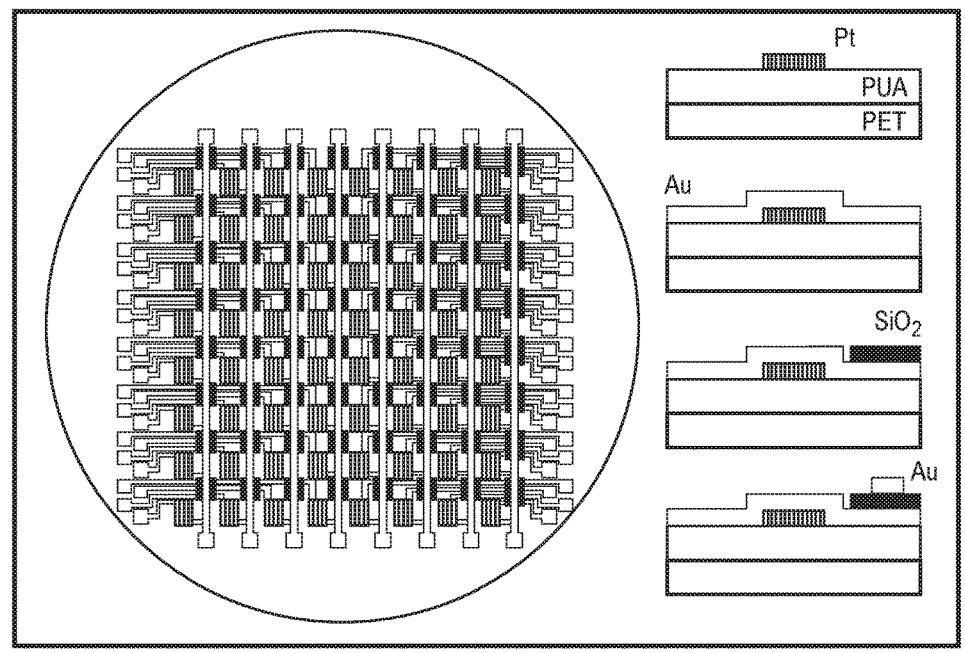
FIG. 11 illustrates a patterned, highly sensitive sensor fabricated in Example 2.

FIG. 11 illustrates a patterned, highly sensitive sensor. The sensor was fabricated by the following procedure.

First, liquid polyurethane acrylate was applied onto a 50 µm thick polyethylene terephthalate (PET) base film having a size of 70 mm×70 mm, and then a flat silicon wafer and an about 2 kg book were sequentially placed thereon. The structure was left standing for about 30 min. After removal of the book, the support layer, to which the wafer was bonded, was allowed to face a UV lamp and irradiated with 365 nm UV light for about 1 min to form an about 3 µm thick flexible polymer layer on the base film.

An about 200 µm thick SUS shadow mask was attached to the surface of the support, and platinum was deposited to a thickness of 20 nm on a large area using a sputtering system (MHS-1500, Moohan Vacuum Corp.). The deposition was performed under the following conditions:

Power: RF300W, Base Pressure: $3.0 \times 10^{-6}$ Torr, Process Pressure: 5 mTorr, Distance: 140 mm, Time: 36-40 sec.

Subsequently, the base film was clamped at both ends thereof and the central hollow region was wound on a glass rod with a 1 mm radius of curvature to form microcracks in the platinum thin film formed on the pattern.

A 200 µm thick SUS shadow mask was attached to the support on which the cracked platinum thin film was formed, and a gold thin film was deposited to a thickness of 60 nm on a large area using a thermal evaporator to form a first electrode. A 200 µm thick SUS shadow mask was attached thereon, and a silica layer was formed to a thickness of 200 nm on a large area using a thermal evaporator to form an insulating layer. Thereafter, a gold thin film was formed to a thickness of 60 nm on the insulating layer through a 200 µm thick SUS mask using a thermal evaporator to form a second electrode.

Subsequently, as in Example 1, a silver paste was used to connect an electric wire to both ends of the first and second electrodes, constructing a multi-channel sensor system.

The multi-channel system consisted of 64 (8×8) sensors, each of which was electrically disconnected from the ambient sensors. The system included a total of 128 electrodes because a pair of electrodes were required in each sensor. As in Experimental Example 1, the electrodes were clamped with parallel buses purchased from National Instruments and were connected to detectors (PXI-4071), which were connected to a computer to collect data.

Experimental Example 2

Figure 12:
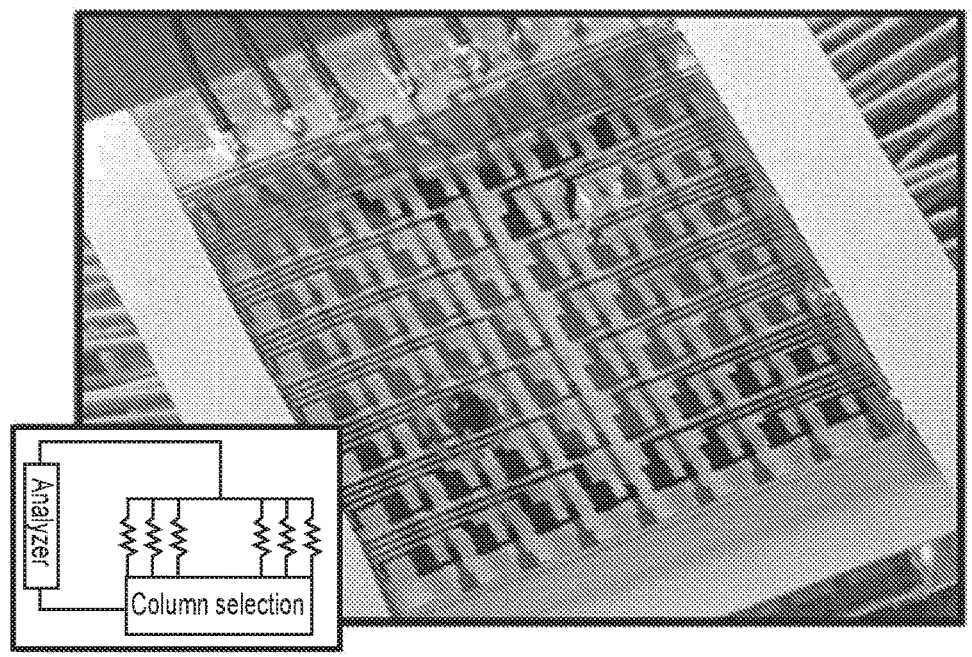
FIG. 12 shows the procedure for pressure measurement using a patterned, highly sensitive sensor fabricated in Example 2.
Figure 13:
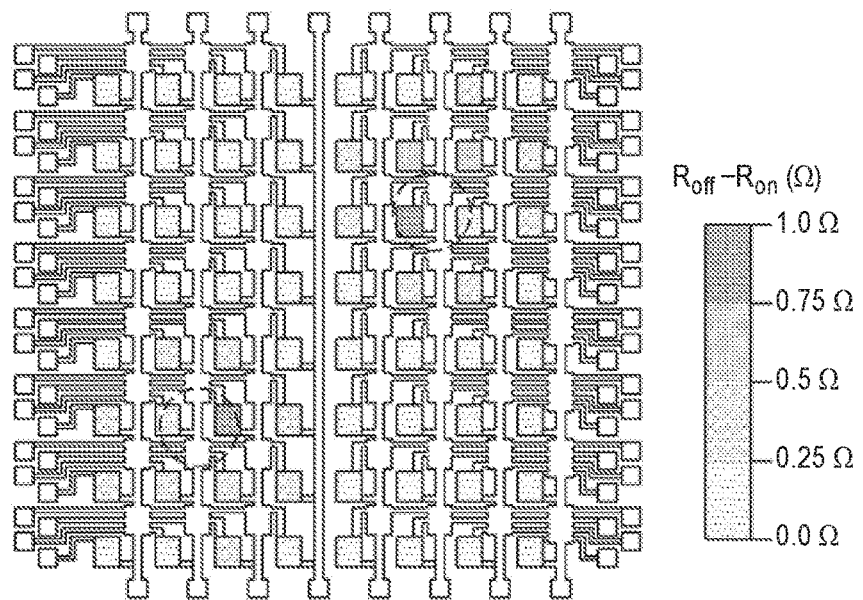
FIG. 13 shows the results of pressure measurement using a patterned, highly sensitive sensor fabricated in Example 2.

As shown in FIG. 12, a ladybird weighing 0.02 g and a PDMS piece having a similar weight to the insect were placed on different areas of the multi-channel system constructed in Example 2. Pressure-dependent resistance values at the 64 sensors were measured by the detectors in accordance with the method mentioned in Example 2. The values of the 64 channels were independently stored because the channels were disconnected from each other. As a result, the resistance values were independently changed at the locations where the insect and the PDMS piece were placed, as shown in FIG. 13. These results demonstrate that the highly sensitive sensors can sensitively sense small changes in pressure and locations where changes occur.

Experimental Example 3

Both distal ends of the highly sensitive sensor fabricated in Example 1 were fixed to the body of a violin with a double-sided adhesive tape. Thereafter, the violin was played with the four strings open. Resistance values of the sensor were measured with a computer, as in Experimental Example 1. The results are shown in FIG. 14.

Figure 14:
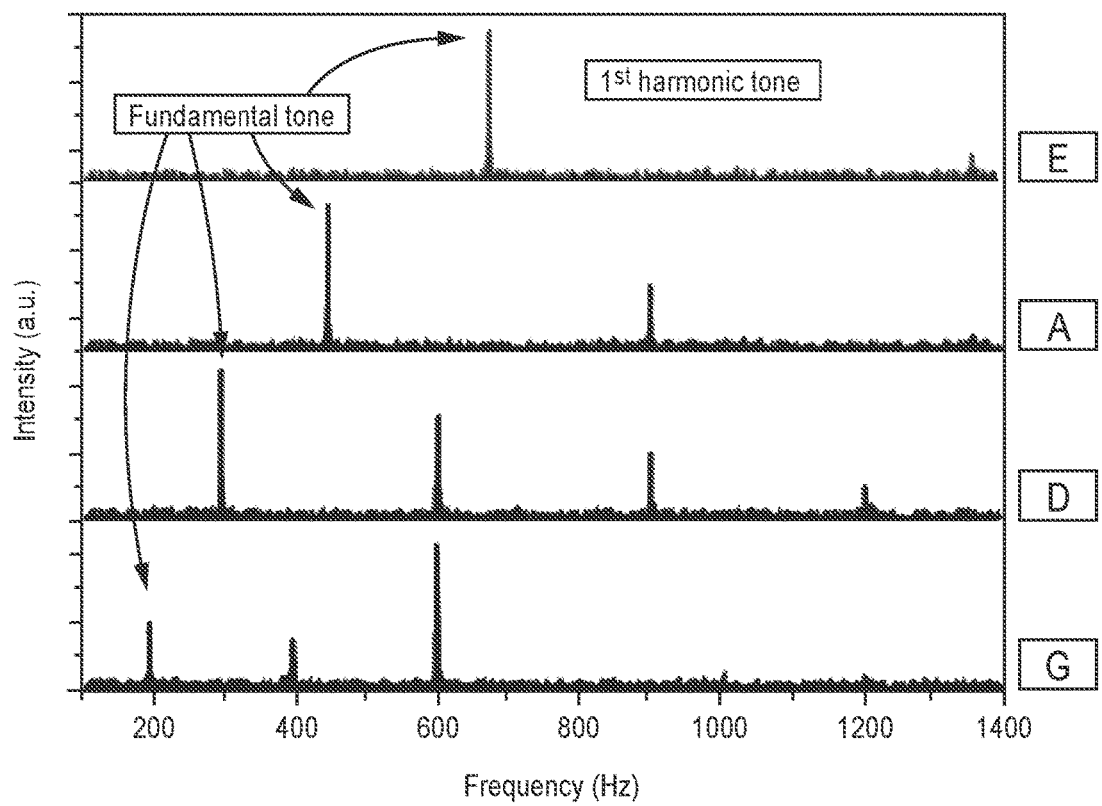
FIG. 14 shows the results of violin frequency measurement in Experimental Example 3.

As shown in FIG. 14, during the violin performance, vibrations at particular frequencies were sensed by the highly sensitive sensor, and changes in resistance and their intensities were measured with the computer. The frequency graph was plotted from values obtained by Fourier transform of the resistance data with the MATLAB program. The resistance data were collected using PXI-4071. The sampling rate was set to 10000.

Experimental Example 4

Figure 15:
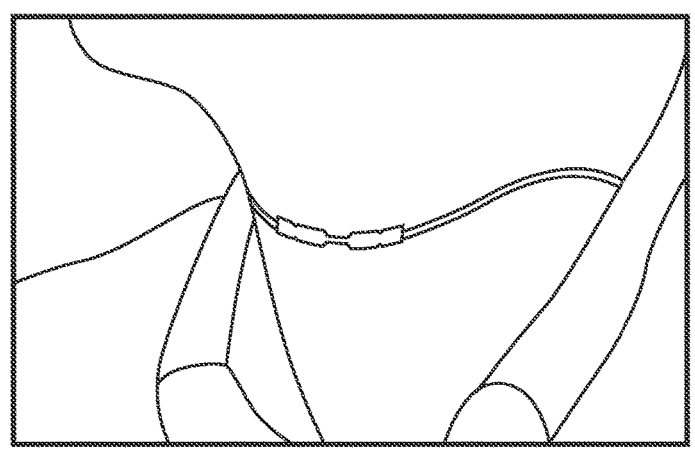
FIG. 15 is a drawing showing a state in which a highly sensitive sensor of Example 1 was attached to the vocal cords.

After the highly sensitive sensor fabricated in Example 1 was attached to person's vocal cords using a Tegaderm film (3M), as shown in FIG. 15, a voice recognition experiment was conducted.

Figure 16:
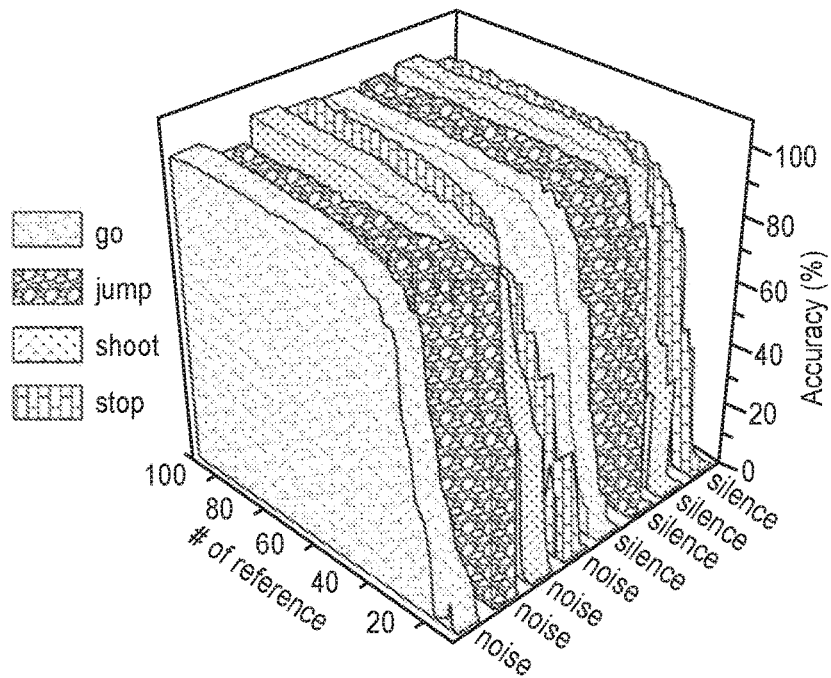
FIG. 16 is a graph showing the results of voice recognition measurement in Experimental Example 4.

The person was asked to pronounce four English words "go", "stop", "jump", and "shoot". Resistance values obtained using PXI-4071 (National Instruments) were stored in a computer and converted into a spectrogram using the MATLAB program. The sampling rate was set to 10000 and the spectrogram window was set to 500. A voice recognition model was constructed from the spectrogram through a learning process with C++ MFC library. Analysis of the voice recognition model indicates that the voices were recognized with accuracy by the highly sensitive sensor, as shown in FIG. 16.

Experimental Example 5

Figure 17:
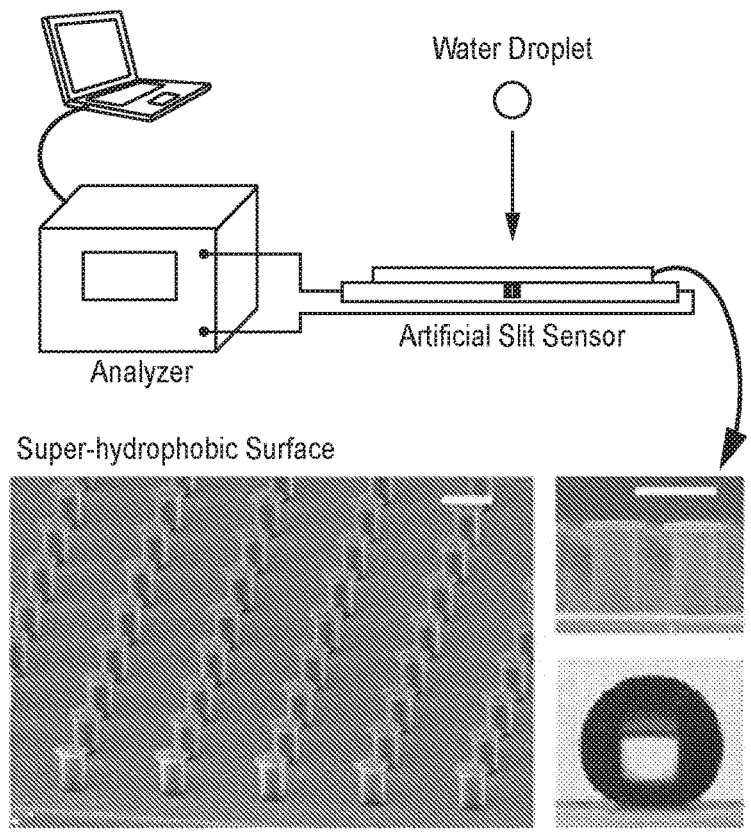
FIG. 17 schematically shows a system for the measurement of pressures applied by a falling water droplet in Experimental Example 5.
Figure 18:
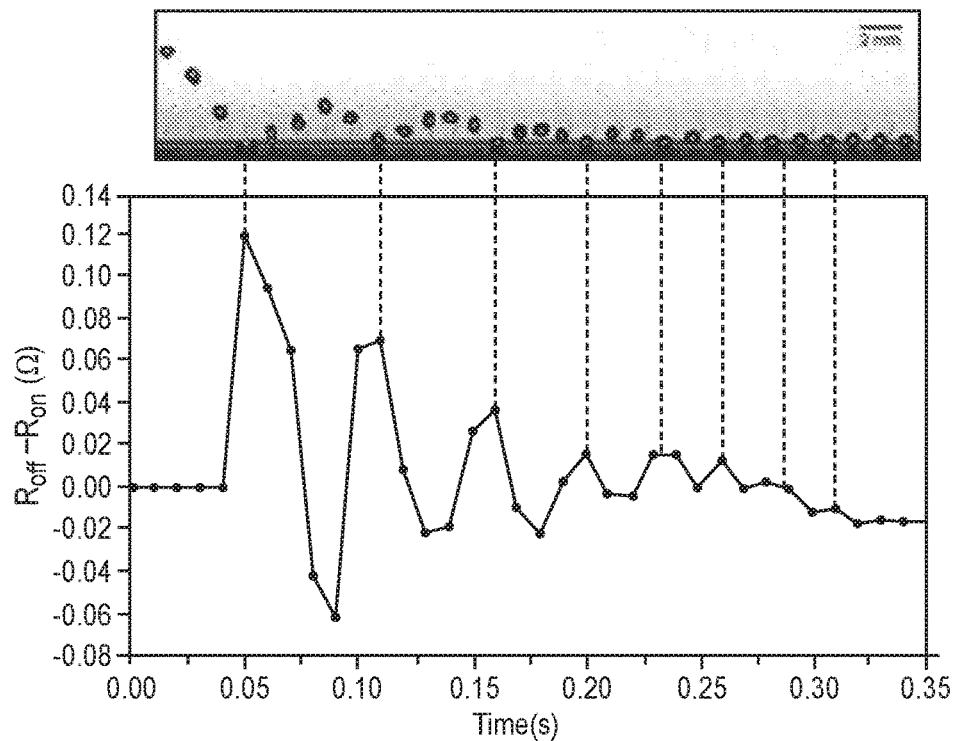
FIG. 18 is a graph showing the measurement results of pressures applied by a falling water droplet in Experimental Example 5.

As illustrated in FIG. 17, the highly sensitive sensor of Example 1 was positioned in contact with the bottom of a slit having a super-hydrophobic surface, and a 3 µl water droplet was dropped from a height of 30 mm onto the surface of the slit. The results are shown in FIG. 18. The moving images were taken at 1,000 frames per sec. As shown in FIG. 18, the resistance values of the highly sensitive sensor were changed whenever the water droplet bounced on the super-hydrophobic surface.

Experimental Example 6

Figure 19:
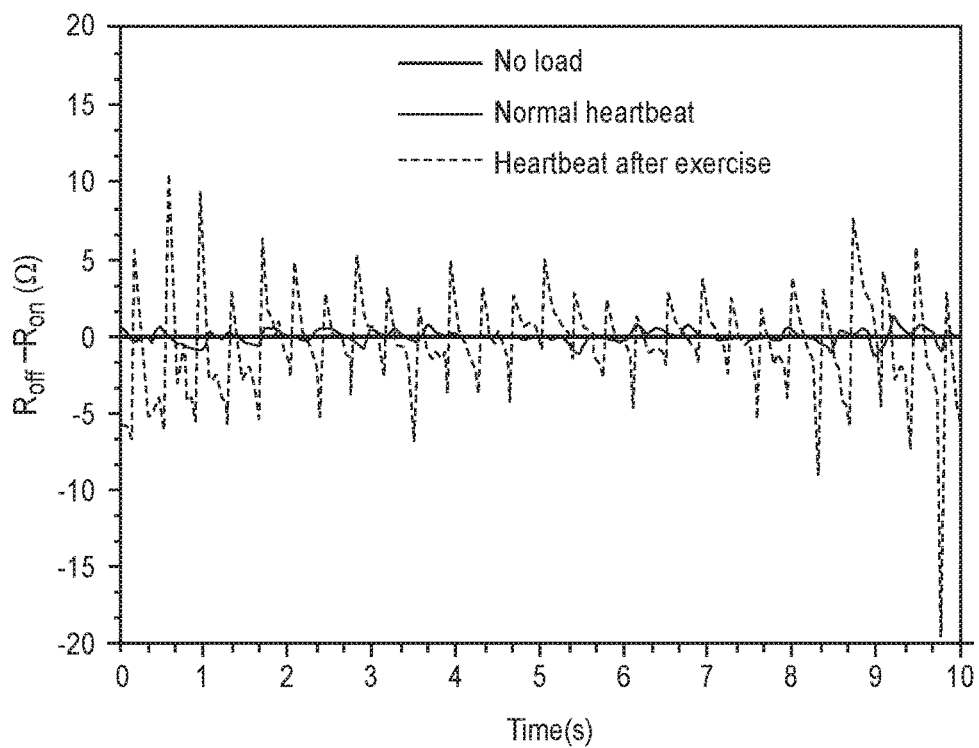
FIG. 19 shows the results of pulse measurement in Experimental Example 6.

Both distal ends of the highly sensitive sensor fabricated in Example 1 were attached to a person's wrist with a double-sided adhesive tape. Changes in resistance in response to the pulses were measured. The results are shown in FIG. 19. A nonpolar material such as silicone oil was spread on the person' wrist for better contact, which enabled more sensitive acquisition of measurement data.

As shown in FIG. 19, the highly sensitive sensor sensed the vibrations and pressures of the pulses, and as a result, its resistance values were changed.

Experimental Example 7

Figure 20:
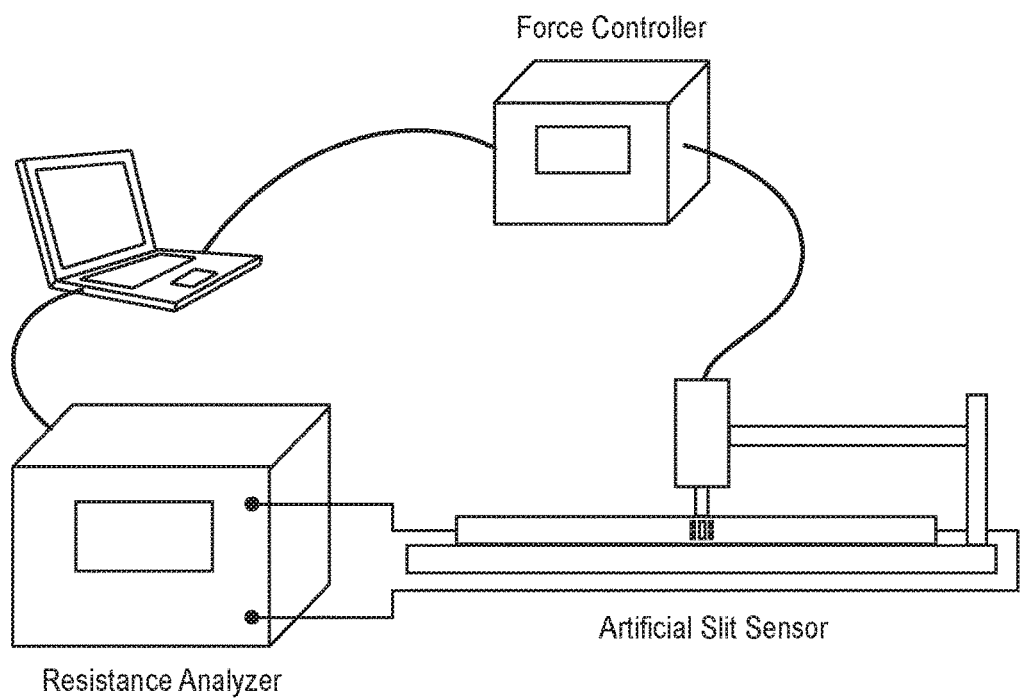
FIG. 20 is a schematic view illustrating a pressure measurement system used in Experimental Example 7.

As shown in FIG. 20, after a pressure of 2 Pa was applied to the highly sensitive sensor of Example 1 using a force controller (FemtoTools), changes in resistance were measured. The results are shown in FIG. 21.

Figure 21:
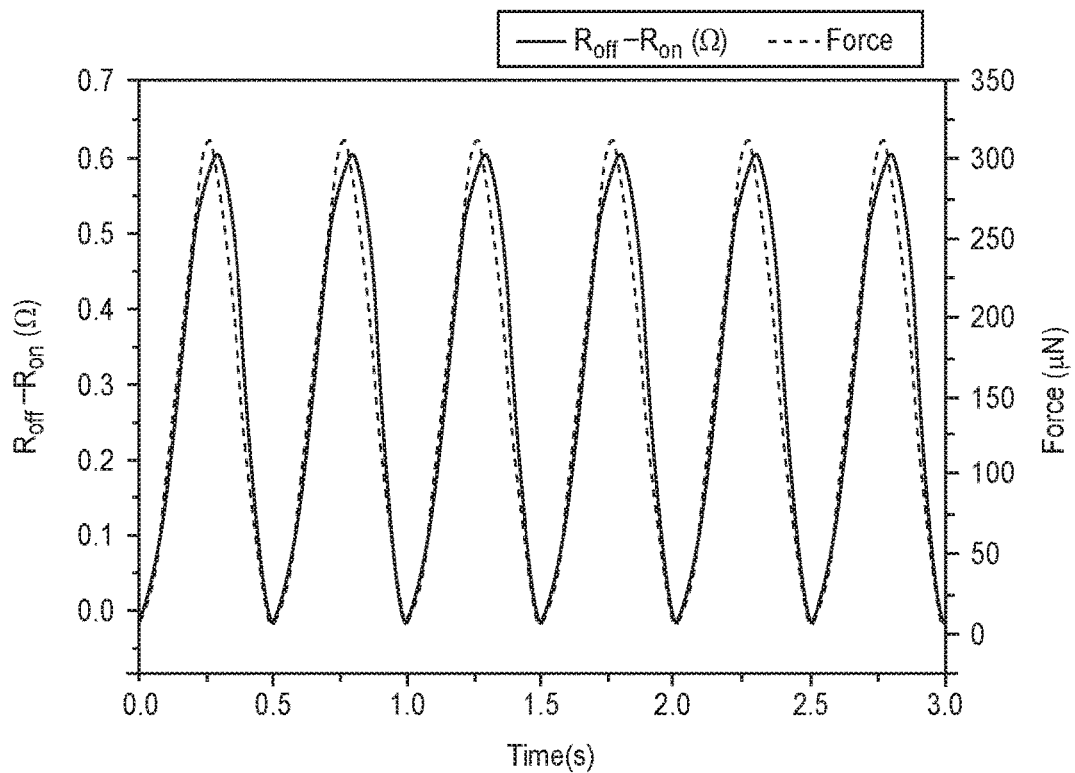
FIG. 21 is a graph showing the results of pressure measurement in Experimental Example 7.
Figure 22:
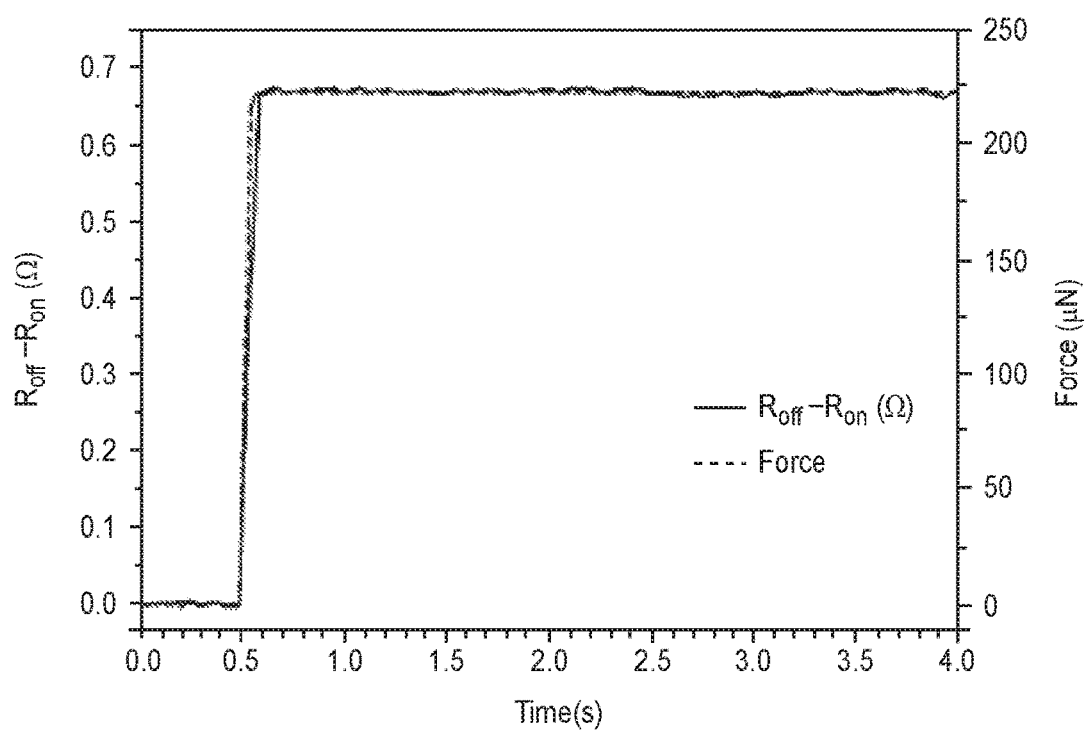
FIG. 22 is a graph showing the results of pressure measurement in Experimental Example 7.

As shown in FIGS. 21 and 22, changes in the pressure applied to the highly sensitive sensor led to changes in resistance. These results indicate that there was almost no time delay between changes in the pressure applied to the highly sensitive sensor and changes in resistance, and that the pressure changes were sensed almost in real time.

While specific embodiments of the invention have been described in detail, it will be appreciated by those skilled in the art that such detailed descriptions are merely preferred embodiments and the scope of the present invention is not limited thereto. Therefore, the true scope of the present invention should be defined by the appended claims and their equivalents.

INDUSTRIAL APPLICABILITY

The highly sensitive sensor of the present invention uses a cracked conductive thin film formed on one side of a support to measure pressures and/or vibrations with high sensitivity. The highly sensitive sensor of the present invention can be utilized in various applications, such as vibration sensors, pressure sensors, and strain gauges. The highly sensitive sensor of the present invention can find application in various fields, such as artificial skins and voice recognition systems, due to its ability to form a flexible structure.

The highly sensitive sensor of the present invention can be fabricated in a simple manner on an industrial scale, thus being advantageous from an economic viewpoint.

The invention claimed is:

1. A highly sensitive sensor comprising:
a support; and
a conductive thin metal film formed on at least one side of the support,
wherein the conductive thin film includes cracks that are artificially formed according to an orientation direction, at least some of which have opposing surfaces in partial contact with each other, the crack surfaces undergo a variation in contact area or disconnection-reconnection events to cause a change in electrical resistance while moving relative to each other in response to external physical stimuli, and the sensor detects the resistance change to measure the external stimuli.

2. The highly sensitive sensor according to claim 1, wherein the cracks are formed along grain boundaries of the conductive thin film.

3. The highly sensitive sensor according to claim 2, wherein the cracks are on a nanometer scale.

4. The highly sensitive sensor according to claim 1, wherein the cracks are electrically shorted or open by an external stimulus to change the electrical resistance values of the conductive thin film.

5. The highly sensitive sensor according to claim 4, wherein the external stimulus is selected from displacements, vibrations, strains, pressures, and combinations thereof.

6. The highly sensitive sensor according to claim 1, wherein the support has a multilayer structure comprising a base film and a flexible polymer layer formed on the base film.

7. The highly sensitive sensor according to claim 1, wherein the conductive thin film has a thickness of 0.1 nm to 1 µm.

8. The highly sensitive sensor according to claim 1, wherein the conductive thin film is formed of at least one conductive material selected from platinum, nickel, copper, gold, silver, iron, chromium, magnesium, zinc, tin, aluminum, cobalt, manganese, tungsten, cadmium, palladium, and carbon.

9. The highly sensitive sensor according to claim 1, wherein the sensor has a gauge factor of 1 to $5 \times 10^8$.

10. The highly sensitive sensor according to claim 1, wherein the sensor has a pressure sensitivity of 0.1 to 1,000 $kPa^{-1}$.

11. A pressure sensor comprising the highly sensitive sensor according to claim 1.

12. A strain gauge comprising the highly sensitive sensor according to claim 1.

13. A vibration sensor comprising the highly sensitive sensor according to claim 1.

14. An artificial skin comprising the highly sensitive sensor according to claim 1.

15. A voice recognition system comprising the highly sensitive sensor according to claim 1.

16. The highly sensitive sensor according to claim 1, wherein the conductive thin film comprises platinum, nickel, copper, gold, silver, iron, chromium, magnesium, zinc, tin, aluminum, cobalt, manganese, tungsten, cadmium, palladium, or a mixture or alloy thereof.

17. The highly sensitive sensor according to claim 1, wherein the conductive thin film has a thickness of 20 nm to 60 nm.

18. The highly sensitive sensor according to claim 6, wherein cracks extend through the whole thickness of the conductive thin film.

19. The highly sensitive sensor according to claim 6, wherein the flexible polymer layer has a thickness from 1 μm to 10 μm.

\* \* \* \* \*